United States Patent [19]

Hamilton et al.

[11] Patent Number: 5,502,644
[45] Date of Patent: Mar. 26, 1996

[54] PROCESS AND APPARATUS FOR AUDITING CROSSTALK AND CHARACTERISTIC IMPEDANCES OF PRINTED WIRING BOARDS

[75] Inventors: Eric A. Hamilton, Butler; Attilio J. Rainal, Morristown; Jere C. Shank, Green Village, all of N.J.

[73] Assignee: AT&T Corp., Murray Hill, N.J.

[21] Appl. No.: 225,012

[22] Filed: Apr. 7, 1994

[51] Int. Cl.$^6$ .................................................. G06F 17/50
[52] U.S. Cl. ........................................... 364/488; 364/578
[58] Field of Search .................................. 364/488, 489, 364/490, 578

[56] References Cited

U.S. PATENT DOCUMENTS

| | | | |
|---|---|---|---|
| 5,081,602 | 1/1992 | Glover | 364/578 |
| 5,198,986 | 3/1993 | Ikeda et al. | 364/489 |
| 5,243,547 | 9/1993 | Tsai et al. | 364/578 |
| 5,279,231 | 1/1994 | Pillage et al. | 364/488 |
| 5,299,136 | 3/1994 | Babakanian et al. | 364/488 |

*Primary Examiner*—Vincent N. Trans
*Attorney, Agent, or Firm*—Alfred G. Steinmetz

[57] ABSTRACT

A tool for designing the conductors into a PWB includes an audit arrangement for auditing or analyzing crosstalk between electrical conductors to be entered into the PWB. This crosstalk audit may be performed as soon as the initial design is created and before actual manufacture of the PWB. It is operative to identify crosstalk problem areas and to identify impedance mismatches. In particular the audit process defines conduction paths into conduction nets conduction nets are selected one at a time for evaluation and simulated as having an idle current condition. Nearby conduction nets are simulated as being driven in an active condition. The response of the idle network is used to derive a plurality of crosstalk parameters which are used to determine the crosstalk effect on the net under test.

10 Claims, 7 Drawing Sheets

```
ISXBP.stk layer  use  diel  diel  cu    path  path
stge  dpth  dpth  wdth  spce
# ─────────────────────────────────────────
  14;    G;    ;          14
  13;    S;    C;   100;  14;   80;   80
  12;    S;    B;   104;  14;   80;   80
  11;    G;    C;   100;  14
  10;    S;    B;   104;  14;   80;   80
   9;    S;    C;   100;  14;   80;   80
   8;    P;    B;   104;  28
   7;    P;    C;   140;  28
   6;    S;    B;   104;  14;   80;   80
   5;    S;    C;   100;  14;   80;   80
   4;    G;    B;   104;  14
   3;    S;    C;   100;  14;   80;   80
   2;    G;    B;   104;  14;   80;   80
   1;    S;    C;   100;  14
```

FIG. 7

| LAYER | USE | diel sig | diel dpth mils | cu dpth mils | path wdth mils | path spcg mils | Z ohms | C' pF/in | L' nH/in |
|---|---|---|---|---|---|---|---|---|---|
| 14 | G | C | 10.0 | 1.4 | | | | | |
| 13 | S | B | 10.4 | 1.4 | 8.0 | 8.0 | 57.886 | 3.009 | 10.044 |
| 12 | S | C | 10.0 | 1.4 | 8.0 | 8.0 | 57.886 | 3.009 | 10.044 |
| 11 | G | B | 10.4 | 1.4 | | | | | |
| 10 | S | C | 10.0 | 1.4 | 8.0 | 8.0 | 56.173 | 3.102 | 9.747 |
| 9 | S | B | 10.4 | 1.4 | 8.0 | 8.0 | 56.173 | 3.102 | 9.747 |
| 8 | P | C | 14.0 | 2.8 | | | | | |
| 7 | P | B | 10.4 | 2.8 | | | | | |
| 6 | S | C | 10.0 | 1.4 | 8.0 | 8.0 | 56.173 | 3.102 | 9.747 |
| 5 | S | B | 10.4 | 1.4 | 8.0 | 8.0 | 56.173 | 3.102 | 9.747 |
| 4 | G | C | 10.0 | 1.4 | | | | | |
| 3 | S | B | 10.4 | 1.4 | 8.0 | 8.0 | 57.886 | 3.009 | 10.044 |
| 2 | S | C | 10.0 | 1.4 | 8.0 | 8.0 | 57.886 | 3.009 | 10.044 |
| 1 | G | C | 10.0 | 1.4 | | | | | |

TOTAL BOARD THICKNESS FROM OUTER DIELECTRIC TO OUTER DIELECTRIC = 144.8 MILS.

FIG. 8

DOMAIN OF CROSSTALK COUPLING (DCC)

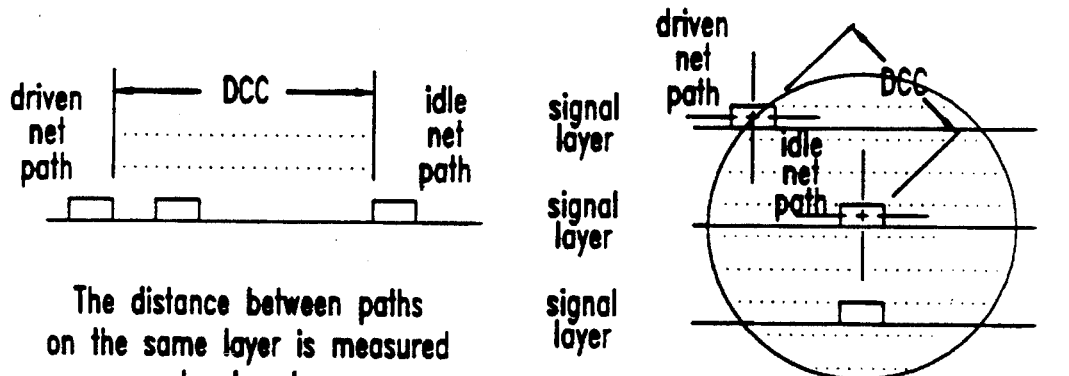

The distance between paths on the same layer is measured edge to edge.

The distance between paths on different signal layers, with no shielding conductor plane layers, is measured center to center.

FIG. 9

| CROSSTALK NET SWITCHING TRANSIENTS DESIGN RULES ||||||
|---|---|---|---|---|---|
| NETS || USE | RISE/FALL TIMES || FREQUENCIES | VLTG |
| CATEGORY | NAME || TYPE || VALUES | SWING |
| ALL NETS | ----- | idle & driven | rise | 9.0, 0.0, 0.0 | 0.0, 0.0, 0.0 | 5.0 |
| NET NAME | SERIAL_TX | idle & driven | rise | 3.0, 0.0, 0.0 | 0.0, 0.0, 0.0 | 3.0 |
| NET NAME | SERIAL_RX | idle & driven | rise | 2.0, 0.0, 0.0 | 0.0, 0.0, 0.0 | 3.0 |

The following example illustrates the direct relationships between items in a typical line from the Net Switching Transients Input File and the items in the corresponding generated design rule, as shown above.

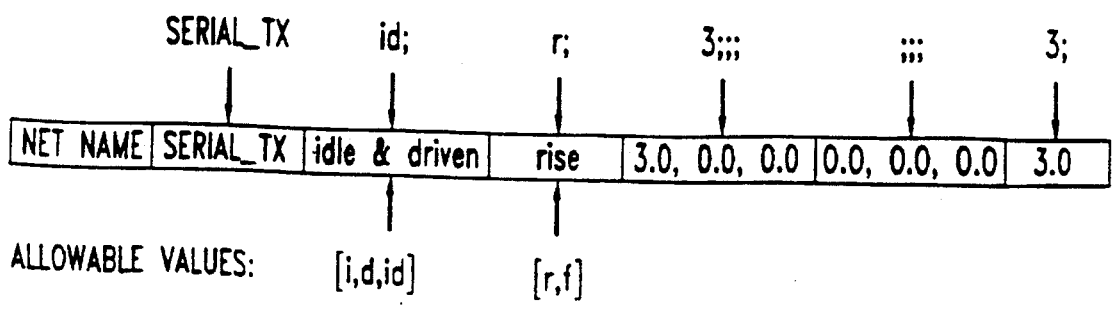

ALLOWABLE VALUES:    [i,d,id]    [r,f]

FIG. 10

Example:

| | |
|---|---|
| OSRAD00;bus1 | 1SRAD01 |
| OSRAD01 | 1SRAD02 |
| OSRAD02 | 1SRAD03 |
| OSRAD03 | A0PCM0;BUS3 |
| OSRAD04 | A0PCM1 |
| OSRAD00;bus2 | A0PCM2 |

In the above example,
- bus1 will contain nets OSRAD00, OSRAD01, OSRAD02, OSRAD03, and OSRAD04;
- bus2 will contain nets 1SRAD00, 1SRAD01, 1SRAD02, and 1SRAD03;
- bus3 will contain nets A0PCM0, A0PCM1, and A0PCM2.

FIG. 11

CROSSTALK AUDIT REPORT

| IDLE NET, #TERM | DRIVEN NET | #CNTR | LAYER | SPACE | COUPL'D LENGTH | RT1,XTALK1 | FR1,XTALK1 | RT2, XTALK2 | FR2,XTALK2 | RT3,XTALK3 | FR3,XTALK3 |
|---|---|---|---|---|---|---|---|---|---|---|---|
| (1) (2) | (3) | (4) | (5) | (6) | (7) | (8) | (9) | (10) | (11) | (12) | (13) |
| DSACK1* 3 | IC12_2 | 1 | 3,3 | 0.0060 | 1.8940 | 2.0, 6.8% | 30.0, 3.1% | 4.0, 3.4% | | 6.0, 2.3% | |
| | DDLCIRQ* | 1 | 3,3 | 0.0060 | 1.8420 | 2.0, 6.6% | 30.0, 2.9% | 4.0, 3.3% | | 6.0, 2.2% | |
| | BRPORT* | 1 | 3,2 | 0.0166 | 1.8940 | 2.0, 4.2% | 30.0, 1.9% | 4.0, 2.1% | | 6.0, 1.4% | |
| | R/W | 1 | 2,2 | 0.0060 | 1.1060 | 2.0, 4.0% | 30.0, 1.8% | 4.0, 2.0% | | 6.0, 1.3% | |
| | BD28 | 1 | 2,2 | 0.0080 | 1.2060 | 2.0, 3.3% | 30.0, 1.5% | 4.0, 1.6% | | 6.0, 1.1% | |
| SUMS (CSums) (CISums) | #NET=52 | 105 | — | — | 34.2050 | 56.3% 14.4% | 23.6% 5.9% | 28.2% 7.2% | | 18.8% 4.8% | |
| AVERAGES (ISums) | | 2.0 | — | 0.0201 | 0.4097 | 13.1% | 5.3% | 6.6% | | 4.4% | |

100 CONTRIBUTIONS DIDN'T EXCEED SEGMENT THRESHOLD 5,502,644

PROCESS AND APPARATUS FOR AUDITING CROSSTALK AND CHARACTERISTIC IMPEDANCES OF PRINTED WIRING BOARDS

FIELD OF THE INVENTION

This invention relates to tools used in the computer aided design of printed wiring boards (PWB) (e.g. also called printed circuit boards PCB) and in particular to a method and apparatus for evaluation of conduction path routing by determining crosstalk and impedance mismatches between various conduction paths of the PWB.

BACKGROUND OF THE INVENTION

A common and serious problem in the performance of a printed wiring board (PWB) is crosstalk or unwanted noise passing between nearby conductors belonging to parts of the circuitry that should be electrically isolated from each other. Beyond a tolerable level, circuit noise diminishes the quality and reliability or destroys the functionality of the PWB and the equipment in which it's installed. Two major causes of circuit noise are impedance mismatching and the too-close parallel coupling of conductors. Denser signal conductor routing, use of thinner dielectric between layers, and higher signal propagation speeds all compound the problem, and PWB design technology is increasingly employing all of these.

One design technique for controlling PWB circuit noise is the shielding of signal conductors. Signal layers are alternated with shielding ground or power plane layers, and/or signal conductor paths in different nets on the same layer are separated by shielding conductor paths connected to a power or ground. Another common technique is to spread apart all conductor paths in different nets by a fixed distance determined empirically, by rule-of-thumb, or by some kind of circuit simulation. Both of these conservative design techniques can consume unnecessarily large amounts of board signal layer area and can force the addition of extra signal layers to contain necessary conductor routing. This, of course, increases manufacturing cost, while not really guaranteeing electrical viability. To assure electrical performance, prototype boards must be built and tested. Failed designs must be redesigned, and the process repeated until acceptable electrical performance is achieved, and manufacture of production boards can begin.

A far more effective approach is to predict the electrical viability of the circuitry on a PWB during the design of the board, rather than after building and constructing prototype boards. This allows the designer to optimize both electrical performance and the use of board layer area, without the need for expensive, overly conservative, broad-based design techniques. Some attempts to accomplish this involve the use of CAD tools such as electrical simulation and conductor parallelism auditing, but these techniques fall short of their objective because they either do not take into consideration all possible electrical and physical factors, don't consider the complete PWB in its entirety, or fail to focus adequately on just the electrical noise question. What is needed is a mechanism to control internal PWB noise by employing crosstalk and characteristic impedance auditing on the entire PWB physical design, based on all net electrical characteristics as well as physical conductor routing configurations, in conjunction with careful circuit routing and editing.

SUMMARY OF THE INVENTION

Therefore, in accordance with the invention, an audit arrangement is provided for auditing or analyzing crosstalk between electrical conductors and identifying impedance mismatches in the PWB. This crosstalk and impedance mismatch audit may be performed as soon as the initial design is created and before proceeding to actual manufacture of the PWB.

In particular, the audit process defines conduction paths into conduction nets. Conduction nets are selected one at a time for evaluation and simulated as having an idle current condition. Nearby conduction nets are simulated as being driven in an active condition. The response of the idle network is used to derive a plurality of crosstalk parameters which are used to determine the crosstalk effect on the net under test. The audit will check any number of nets, from one to all on the board, and it will consider crosstalk from all possible contributor nets, both on the same layer and on other unshielded layers. For ease and speed of analysis, it reports potential crosstalk in net-by-net, descending severity order, with the worst contributors appearing first.

Input to the audit consists of the physical design database, a board stackup description, the net scope to be audited, net bussing specifications, net coupling specifications, and net switching transients. Net switching transients include the amplitude, rise time, and/or frequency of the signal on each net or group of nets. Output from the audit consists of a crosstalk report, a scaled stackup drawing/electrical report, and interactively queryable contribution graphics.

A unique, major feature of this process is the audit's dynamic modeling capability. Dynamic modeling automatically determines electrical characteristics: capacitances per unit length, inductances per unit length, and characteristic impedances, for the entire PWB, based on a brief textual description of the physical board stackup, provided by the user. These electrical characteristics are reported to the user and later used in auditing the physical routing for crosstalk. Dynamic modeling renders this apparatus universally adaptable for use in different CAD tool frameworks. This audit is an integral and essential part of the PWB design and manufacturing process. It may be applied to a broad variety of board styles and technologies, including mixed component logic, bussed nets, synchronous and asynchronous nets, and balanced pair nets. The tool is especially effective on modern, dense, high-speed, multi-layer boards, having few or as many as sixty-four layers of interconnection.

BRIEF DESCRIPTION OF THE DRAWING

FIG. 7 is a schematic of an example of an electrical modeling report, and illustrates output from item 306 from block 305 in FIG. 3;

FIG. 8 schematically illustrates the domain of crosstalk coupling;

FIG. 9 is a schematic of an example of a net switching transient input file and illustrates input item 405 in FIG. 4;

FIG. 10 is a schematic of an example of a bussed net specification and illustrates input item 406 in FIG. 4;

FIG. 11 is a schematic of an example of a crosstalk report for a single net and illustrates output item 406 in FIG. 4.

DETAILED DESCRIPTION

Figure 1:
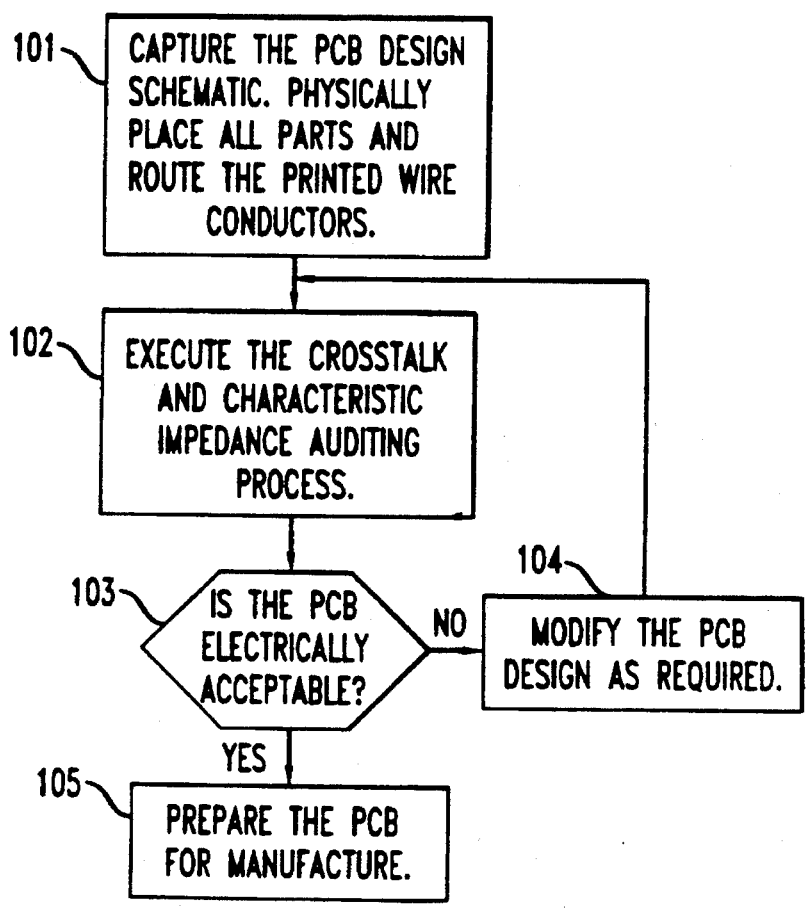
FIG. 1 is a schematic of a flowchart of the printed wiring/circuit board design process using the crosstalk/impedance audit apparatus.

The overall process for preparing a PWB for manufacture is illustrated by the flow chart disclosed in FIG. 1. As illustrated in block 101 in FIG. 1, this process is used during the computer assisted design [CAD] of a printed circuit board [PWB]. At this point in time the physical layout is determined and the board layout has its component pans placed in final locations and its necessary circuit conductor paths routed. The crosstalk and characteristic impedance auditing process, block 102 in FIG.1, begins with the dynamic modeling process, illustrated by block 201 in FIG. 2, and includes reading and parsing the textual stackup description of the PWB, as discussed herein below and illustrated in FIG. 5. Physical dimensions in this schematic are expressed in units of one-tenth mils. The stackup description is built by and described in a text file by an interactive tool which uses a series of prompts and responses to request and receive the needed PWB stackup information. Such an interactive tool is well known to those skilled in PWB design and need not be disclosed herein. To save keystrokes, this tool attempts to use previously entered default values, echoing them to the user. The tool sanity checks all input values and permits re-entrance to correct numeric values. The tool writes the stackup description into a text file in an ordered format that's easily readable by the crosstalk audit dynamic modeling parser and humans.

The results of the crosstalk and impedance audit are evaluated, as per decision block 103, to determine if the results of the audit are acceptable to the designer given the projected use of the PWB. If the results are not satisfactory, the design is modified, as per block 104, and a new crosstalk and impedance audit is performed on the new PWB design. When the audit results are satisfactory, the PWB is prepared for manufacture, as per block 105.

Figure 2:
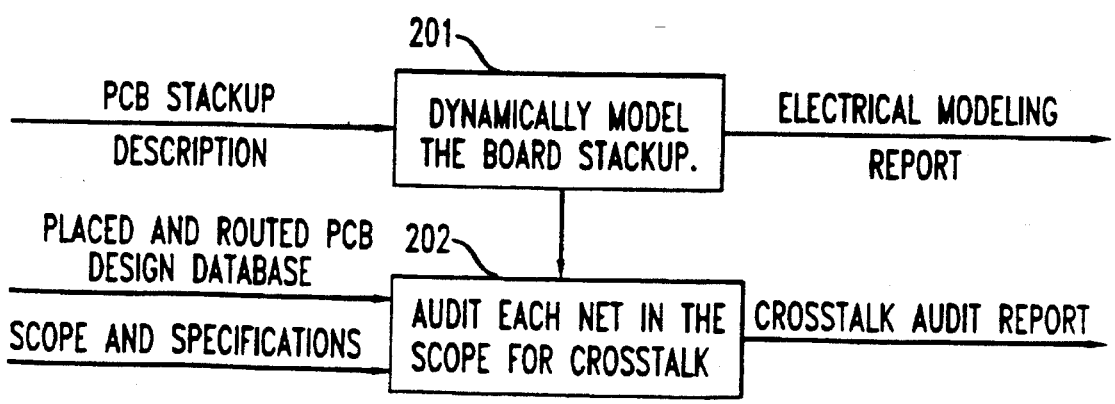
FIG. 2 is a high-level block schematic of a flow chart of the process of auditing a PWB for crosstalk and characteristic impedance and represents an expansion of block 102 in FIG. 1.

The block diagram of FIG. 2 discloses a crosstalk and impedance match audit process. The PWB stackup description is entered in a text description mode where it is used, as per block 201, to dynamically model the board stackup. This model is described with conductor nets representing arrays of conductors. Selected conductor nets are evaluated for crosstalk connections. The results of this audit are made available as a crosstalk and impedance match report.

Figure 3:
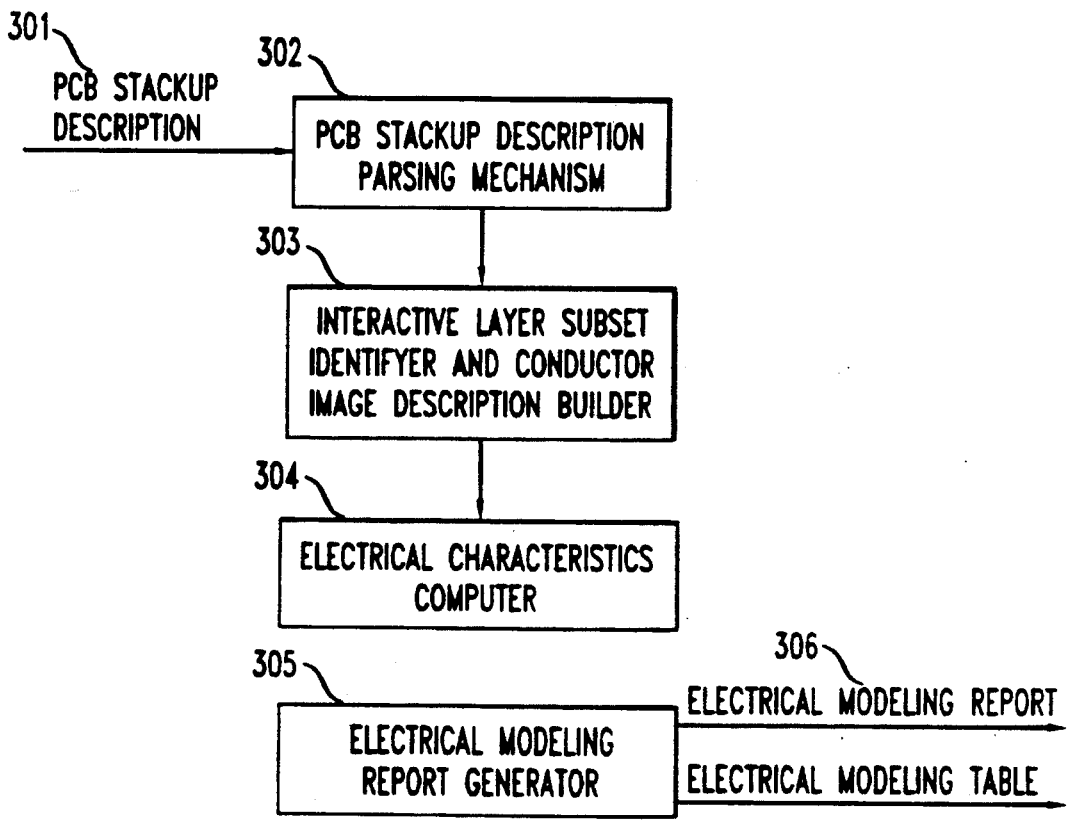
FIG. 3 is a block diagram of a flowchart of the process of dynamic electrical modeling of a PWB stackup, and represents a decomposition of block 201 201 in FIG. 2.
Figures 5, 6:
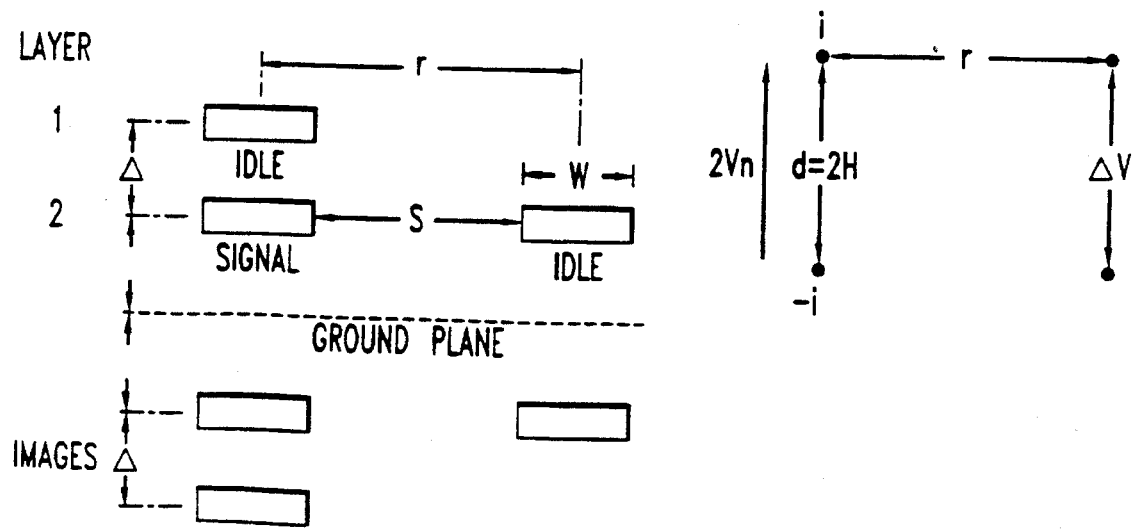
FIG. 5 is a schematic of an example of a textual PWB stackup input description for a 14 layer board, and illustrates input item 301 in FIG. 3.
FIG. 6 is a schematic of an example of an unbalanced microstrip transmission line conductor image diagram, and illustrates the conductor image description building operation of block 303 in FIG. 3.

The process of dynamic modeling of block 201 in FIG. 2 is shown in more detail in FIG. 3. The PWB stackup description parsing mechanism, as per block 302 in FIG. 3, reads and parses the stackup description, input item 301, subdividing it into subsets of signal conductor layers, bounded top and bottom, respectively, by one or two shielding plane layers or by one or both outer board surface layers. These subsets of signal conductor layers are unshielded from each other and can, thus, exchange crosstalk. From each of these interactive layer subsets, in turn, as indicated by block 303, one conductor image description is built around the driven signal conductor for each signal layer. An exemplary conductor image description is illustrated in FIG. 6. This FIG. 6 has previously appeared as FIG. 1 in section I of an article Rainal, A. J., entitled, "Transmission Properties of Balanced Interconnections," *IEEE Transactions on Components, Hybrids, and Manufacturing Technology*, Vol. 16, No. 1, February 1993, pp. 137–145. The teachings of this article are incorporated herein.

In addition to the driven signal conductor, the conductor image description contains idle signal conductor images. Each of these conductor image descriptions is submitted to the electrical characteristics computer, as indicated in block 304, which returns characteristic impedance, capacitance per conductor unit length, and inductance per conductor unit length for that driven signal layer. A generalization of the method described in section II of the aforementioned article presents a convenient method for determining the characteristic impedance, Z, the capacitance per unit length, C', and the inductance per unit length, L'. These parameters are given by the relations $$C' = \frac{T_D}{Z} \text{ nanoFarads/inch}$$

and $$L' = T_D Z \text{ nanoHenries/inch,}$$

where $$T_D = \frac{1.016}{12} \sqrt{\epsilon_r} \text{ nanoseconds/inch,}$$

and $\epsilon_r$ = Effective dielectric constant.

The electrical modeling report generator, as indicated by block 305, formats a printed report, output item 306, containing a scaled cross-sectional drawing of the board stackup, layer usages, copper thicknesses, signal conductor widths, signal conductor spacings, dielectric thicknesses, characteristic impedances, capacitances, and inductances, such as illustrated in FIG. 7. This information, with the exception of the scale drawing, is also placed in an internal table for later use by the crosstalk audit.

The board designer or circuit engineer running this apparatus may choose to stop at this point to verify that the physical stackup is exactly correct and/or that the computed electrical characteristics are all acceptable. The circuit engineer may, in fact, choose to reiterate this modeling mechanism, varying stackup parameters, especially dielectric thickness and conductor width, in order to achieve a desired set of electrical characteristics, in particular, acceptably matched characteristic impedances.

Figure 4:
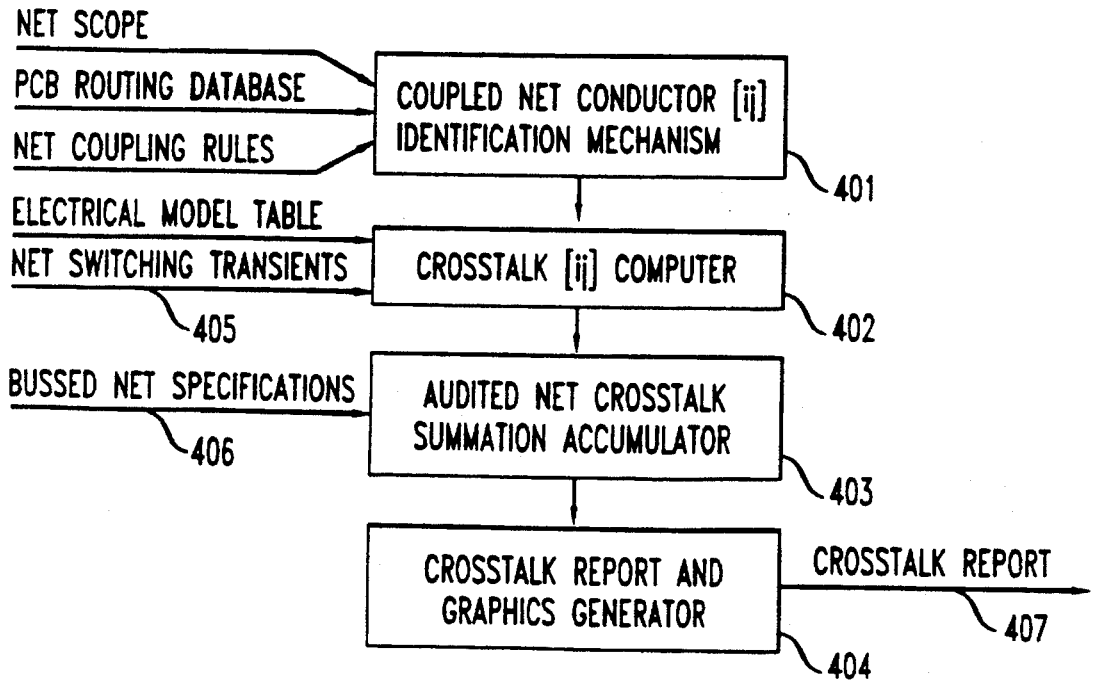
FIG. 4 is a block diagram of a flowchart of the process of auditing a PWB for crosstalk, and represents a decomposition of block 202 in FIG. 2.

The crosstalk audit machinery, of block 202 in FIG. 2, is further decomposed into process steps disclosed in the block diagram of FIG. 4. The first step of this process identifies every pair of coupled idle/driven conductor path segments, as indicated in block 401. Coupled path segments are defined as two parallel conductors belonging to different nets that are in close enough proximity to exchange crosstalk. The audit assumes that the net being audited is idle (contains no voltage) and that, at the same time, all other signal nets may be driven (carrying voltage). The exact rules of the audit are user selected. Certain nets may not be considered to be driven if that condition is specified in net bussing or net coupling rules.

The step of defining nets to be audited requires three inputs: the net scope or set of nets to be audited; the PWB routing database, containing all the board's physical conductors; and the net coupling rules, which specify thresholds, the domain of crosstalk coupling, and whether certain nets may or may not contribute crosstalk to each other. A segment threshold rule is used to filter out small contributions not likely to be of interest to the circuit engineer. Typically set to a low single digit percent value, it causes only those coupled segment crosstalk contributions exceeding this value to be individually saved and reported. Nevertheless, despite local rule setting, all contributions, whether individually reported or not, are included in displayed accumulated sums provided in the final tabulated results. This is displayed in terms of a coherent sum [CSum], a coherent/incoherent sum [CISum] and an incoherent sum [ISum]. Either the coherent sum [CSum] or incoherent sum [ISum] threshold, defined herein below, is used to filter out whole audited nets, deemed not significant, whose calculated crosstalk is less than the limiting threshold amount. The CSum is a worst case estimate which assumes that signals of all contributing signal nets to crosstalk are in phase. The ISum represents a random distribution of contributing signal net phasing. The circuit engineer specifies which of these thresholds is to be used and the percentage value.

As illustrated in FIG. 8, the domain of crosstalk coupling is set by a preset maximum distance between parallel coupled path segments. The audit process does not consider contributions from a driven net conductor path segment farther than this distance from a conductor path segment of the idle net being audited.

Each coupled pair of conductor path segments is submitted to the crosstalk computer, as indicated by block 402. The crosstalk computer additionally requires as input the tabular electrical model data previously stored and developed by the dynamic modeling process, the amplitude of the idle net, and the switching transients of the driven net: amplitude (a voltage swing) and risetime or frequency. These net switching transients are specified in a text file, as input item 405, as illustrated in FIG. 9, which can be manually produced or automatically created from a library of component data. Let $X_{ij}$ denote the near-end crosstalk contribution at a particular idle net resulting from the j'th segment of the i'th driven net. $X_{ij}$ depends on the amplitude and risetime or frequency assigned to the i'th driven net, the coupled length of the j'th segment, and the proximity of the j'th segment to the idle net of interest. Also, $X_{ij}$ is normalized so that it represents the percent crosstalk contribution relative to the signal amplitude on the idle net when the idle net is active. A generalization of the method described in section III of the aforementioned article presents a convenient method for evaluating the $X_{ij}$.

The individual $X_{ij}$ crosstalk contributions are accumulated in three separate sums, as per block 403. If the PWB has nets whose voltage waves are in phase and are grouped into busses, this step requires input of the bussed net specifications, in a text file, as per input item 406, as illustrated in FIG. 10. The coherent sum (CSum) is computed as:

$$CSum = \sum_{i,j} X_{ij}.$$

The coherent-incoherent sum (CISum) is computed as:

$$CISum = \sqrt{\sum_i \left( \sum_j X_{ij} \right)^2}.$$

The incoherent sum (ISum) is computed as:

$$ISum = \sqrt{\sum_{i,j} X_{ij}^2}.$$

In all cases we have the constraint that ISum<=CISum<= CSum. The CSum is mostly useful when there are only a few significant $X_{ij}$ terms acting on a particular idle net. A $X_{ij}$ term is considered to be significant when $X_{ij}$>the assigned segment threshold value (usually set to a minimum of 0.1%). In general, the ISum is most useful and is indicated or highlighted by an arrow on the output report. The CISum shows the rapid approach to the more useful ISum, and results when the segment crosstalk contributions are coherent, as in the CSum, but the driven nets are now considered incoherent.

If the sum of all crosstalk contributions from any driven net equals or exceeds its saturation value, the designation "SAT" appears adjacent to the CSum entry on the print-out. Saturation crosstalk is the maximum amount of crosstalk a driven net can possibly contribute to an idle net, regardless or increased conductor path coupling. A similar saturation effect is also included in the CISum and ISum entries. Also, the CSum, CISum, and ISum entries include crosstalk contributions from all bussed nets which are designated by the user.

Because they are all driven simultaneously, member nets of the same bus cannot contribute crosstalk to each other. Additionally, when calculating the incoherent sum of crosstalk contributions to an idle net not in the bus, contributions from driven net members of the bus, because they're all in phase, are treated coherently, rather than incoherently as are driven nets not in a bus. Calculation of the coherent sum of crosstalk is not affected because this assumes a worst case situation in which all driven net contributors are in phase.

Results of the crosstalk audit are presented in a report, as per output item 407, viewable either interactively on the computer terminal or printed, block 404. Two types of report are available, summary or detailed. Both report accumulated sums for each audited net, but, in addition, the detailed report lists each individual crosstalk contribution that exceeds the segment threshold. The user may choose to have the report sorted by net name, net number, or magnitude of crosstalk. When using the magnitude of crosstalk ordering, typically the most useful, the audited idle nets receiving the greatest amounts of crosstalk will appear at the top of the report, and the driven nets contributing the greatest amounts of crosstalk will appear at the top of the report section for each receiving idle net. FIG. 11 contains an example of output item 407, a detailed crosstalk report for a single net.

The tabular report of FIG. 11, includes a plurality of columns, listed below, which appear in a segment contribution section of the detailed report. IDLE NET—the name of the idle net receiving crosstalk. #TERM—the number of terminals within the idle net. DRIVEN NET—the name of the driven net contributing crosstalk. #CNTR—the number of conductor path segments contributing crosstalk.

LAYER—the layers on which the idle and driven nets are located. The first number is the idle net layer; the second is the driven net layer. SPACE—the distance between the idle and driven path segments. COUPLED LENGTH—the distance that the two path segments are parallel. RT1, XTALK1—the first rise time value and the crosstalk percentage derived from it. FR1,XTALK1—the first frequency value and the crosstalk percentage derived from it. RT2, XTALK 1 the second rise time value and the crosstalk percentage derived from it. FR2,XTALK1— the second frequency value and the crosstalk percentage derived from it. RT3,XTALK1—the third rise time value and the crosstalk percentage derived from it. FR3,XTALK1—the third frequency value and the crosstalk percentage derived from it. The user has the option of specifying from one to three rise times and/or from one to three frequencies for a driven net. A blank entry will appear in the report in any crosstalk result column for which a rise time or frequency, respectively, was not provided.

As shown in FIG. 11, the following summary rows appear in the detailed report. SUMS (CSums)—lists the total number of contributing driven nets, the total number of contributing conductor path segments, the total coupled segment length, and the coherent crosstalk sum derived from each of the three rise times and each of the three frequencies. (CISums)—lists the coherent/incoherent crosstalk sum derived from each of the three rise times and each of the three frequencies. AVERAGES (ISums)—lists the average number of segment contributors per driven net, the average spacing (inches) between coupled path segments, weighted according to the coupled length; the average coupled length (inches) of path segments, weighted according to the reciprocal of the spacing; and the incoherent crosstalk sum (%) derived from each of the three rise times (nanoseconds) and each of the three frequencies (megaHertz). The incoherent crosstalk sum based on frequency is also expressed in decibels of (DB) noise. A message line D reports the number of contributions for this idle net that did not exceed the segment threshold, and have, therefore, not been individually reported, although they are included in the CSum, ISum and CISum. The audit process also generates computer graphics to identify individual crosstalk contributions and assist the designer in editing the conductors.

At this point in the process, the PWB designer and circuit engineer use the crosstalk audit results to determine whether the PWB is electrically acceptable for manufacture, block 103 in FIG. 1. Unfavorable results indicate the need for modification of the PWB design, possibly conductor routing, component placement, or even circuit logic. On the other hand, should the audit results be very favorable, the question may also be asked whether the PWB can be re-routed with tighter conductor path clearances, so as to compress routing, possibly eliminate signal routing layers, and reduce manufacturing costs. Any necessary modifications to the PWB design are now performed, as per block 104 in FIG. 1, and the revised PWB design is again re-audited. This process iterates until the design is acceptable, at which time final preparations for manufacture are performed, as per block 105 in FIG. 1. In automated applications the changes may be implemented automatically as part of a computer automated manufacturing (CAM) process.

Figure 12:
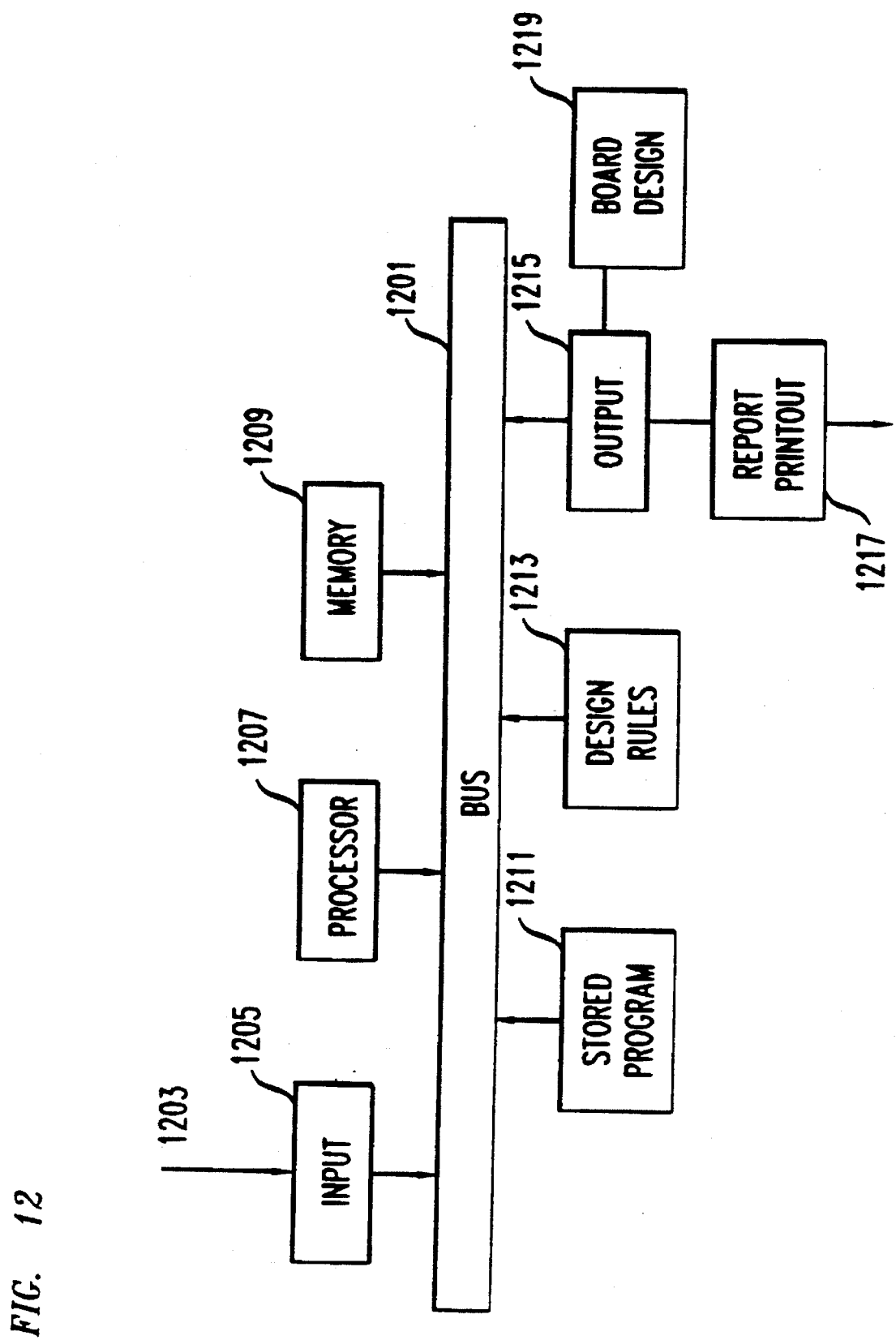
FIG. 12 is a schematic of a dynamic processor arrangement for evaluating crosstalk of a PWB.

An illustrative design system in which the principles of the invention may be applied is shown in the stored program processor system in the FIG. 12. The design input is applied to an input device 1205 via input lead 1203. This information is the design particulars of the circuit board under investigation. The input device is connected to the system bus 1201. Design particulars of the circuit board are stored in the memory 1209. The processing of the stored input information is performed by the processor device 1207 connected to the bus 1201. The stored program controlling the audit process is included in the program memory 1211 and the audit design rules and selected limitations are included in the rules memory 1213. The results of the audit are output to the output device 1215. This device is connected in this illustrative embodiment to a report print output device 1217 which provides a hard copy of the results. Another output may be directly connected to a board design system 1219 to permit redesign in response to the audit results. This board design system may be an automatic processing arrangement or it may be performed by manual techniques.

We claim:

1. A method of auditing crosstalk between conductors in a printed wiring board (PWB) comprising the steps of:

defining conductors into conduction nets;

selecting conduction nets one at a time and designating as idle;

designating nearby conduction nets other than the selected conduction net as driven in an active condition;

computing a response of the selected conduction net and developing therefrom a plurality of crosstalk parameters including a coherent sum, a coherent-incoherent sum and an incoherent sum;

evaluating the crosstalk parameters to determine the effect of crosstalk on the selected conduction net;

integrating the crosstalk design parameters into a design and manufacturing process of the PWB.

2. A method of auditing crosstalk between conductors in a printed wiring board (PWB), as claimed in claim 1, comprising the further steps of:

defining a crosstalk domain for limiting the number of nearby conduction nets stimulated.

3. A method of auditing crosstalk between conductors in a printed wiring board (PWB), as claimed in claim 1, comprising the further steps of:

identifying the sources of crosstalk in a hierarchical order of contributors.

4. A method of auditing crosstalk between conductors in a printed wiring board (PWB), as claimed in claim 1, comprising the further steps of:

inputing the description of the PWB in terms of a textual description of the PWB stackup.

5. A method of auditing crosstalk between conductors in a printed wiring board (PWB), as claimed in claim 1, comprising the further steps of:

inputing the description of the PWB in terms of synchronized bus nets.

6. A method of auditing crosstalk between conductors in a printed wiring board (PWB), as claimed in claim 1, comprising the further steps of:

inputing the description of the PWB in terms of balanced (i.e. differential) pair nets.

7. A method of auditing crosstalk between conductors in a printed wiring board (PWB), as claimed in claim 1, comprising the further steps of:

inputing the description of the PWB in terms of net switching transient data derived from components from different logic circuit families.

8. A method of evaluating conduction path routing of a printed wiring board (PWB) by a crosstalk audit between conduction paths contained within the (PWB), comprising the steps of:

determining selected parameters of the PWB to be evaluated;

generating a dynamic model of the PWB from the selected parameters, the dynamic model of the PWB defining the conduction paths into conduction nets;

selecting a conduction net to be evaluated and designating an idle current condition for the conduction net selected and designating a driven conduction condition for at least a plurality of other conduction nets of the PWB;

computing an interference parameter $x_{ij}$ representing voltage crosstalk between each of the conduction nets that are driven and the conduction net that is idle;

determining individual crosstalk contributions of the conduction path segments of the driven net contributing to crosstalk of the conduction net that is idle;

firstly summing the individual crosstalk contributions as the first variable $$CSum = \sum_{i,j} Xij$$

attributable to voltage and comparing the CSum with a threshold value;

secondly summing the individual crosstalk contributions as the second variable sum $$CISum = \sqrt{\sum_i \left( \sum_j Xij \right)^2} \, ;$$

and thirdly summing the individual crosstalk contributions as the third variable $$ISum = \sqrt{\sum_{i,j} Xij^2} \, .$$

9. A method of evaluating conduction path routing of a printed wiring board (PWB) by a crosstalk audit between conduction paths contained within the (PWB), as claimed in claim 1 and comprising the further steps of:

establishing a domain of crosstalk coupling by setting a maximum distance between a conductor of the idle net and conductors of the driven net at which the interference parameters $x_{ij}$ are evaluated.

10. Apparatus for evaluating conduction path routing on a printed wiring board (PWB); including:

a processor and associated memory;

input means for entering a PWB design into the memory;

means for providing instructions to the memory for enabling the processor to conduct a crosstalk audit of conductor networks included in the PWB design;

wherein the instructions carry out the process steps of:

generating a dynamic model of the PWB from the selected parameters, the dynamic model of the PWB defining the conduction paths into conduction nets;

selecting a conduction net to be evaluated and designating an idle current condition for the conduction net selected and designating a driven conduction condition for at least a plurality of other conduction nets of the PWB;

computing an interference parameter $x_{ij}$ representing voltage crosstalk between each of the conduction nets that are driven and the conduction net that is idle;

determining individual crosstalk contributions of conduction path segments of the driven net contributing to crosstalk of the conduction net that is idle;

firstly summing the individual crosstalk contributions as the first variable $$CSum = \sum_{i,j} Xij$$

attributable to voltage and comparing the first sum with a threshold value;

secondly summing the individual crosstalk contributions as the second variable sum $$CISum = \sqrt{\sum_i \left( \sum_j Xij \right)^2} \, ;$$

and thirdly summing the individual crosstalk contributions as the third variable sum $$ISum = \sqrt{\sum_{i,j} Xij^2} \, .$$

\* \* \* \* \*